(12) United States Patent
Kim et al.

(10) Patent No.: US 7,142,343 B2
(45) Date of Patent: Nov. 28, 2006

(54) ELECTRO-ABSORPTIVE OPTICAL MODULATOR MODULE HAVING MONOLITHIC INTEGRATED PHOTO DETECTOR

(75) Inventors: In Kim, Suwon-si (KR); Young-Hyun Kim, Suwon-si (KR); Byung-Kwon Kang, Suwon-si (KR)

(73) Assignee: Samsung Electronics Co., Ltd., Suwon-Si (KR)

( * ) Notice: Subject to any disclaimer, the term of this patent is extended or adjusted under 35 U.S.C. 154(b) by 79 days.

(21) Appl. No.: 10/837,938

(22) Filed: May 3, 2004

(65) Prior Publication Data

US 2005/0128557 A1 Jun. 16, 2005

(30) Foreign Application Priority Data

Dec. 16, 2003 (KR) .................. 10-2003-0091891

(51) Int. Cl.
*G02F 1/03* (2006.01)
*G02F 1/07* (2006.01)

(52) U.S. Cl. .................. 359/245; 359/315; 359/254
(58) Field of Classification Search .................. 359/245
See application file for complete search history.

(56) References Cited

U.S. PATENT DOCUMENTS

| | | | |
|---|---|---|---|
| 5,712,864 A * | 1/1998 | Goldstein et al. ........ 372/50.21 |
| 6,301,283 B1 * | 10/2001 | Chen et al. ................... 372/96 |
| 6,771,682 B1 * | 8/2004 | Peters ........................ 372/50.1 |
| 6,815,786 B1 * | 11/2004 | Ogasawara et al. ......... 257/432 |
| 6,862,136 B1 * | 3/2005 | Koren et al. ................ 359/344 |
| 2003/0095736 A1 * | 5/2003 | Kish et al. .................... 385/14 |
| 2004/0105476 A1 * | 6/2004 | Wasserbauer ................ 372/50 |

* cited by examiner

*Primary Examiner*—Jordan M. Schwartz
*Assistant Examiner*—Jessica Stultz
(74) *Attorney, Agent, or Firm*—Cha & Reiter, L.L.C.

(57) ABSTRACT

An electro-absorptive optical modulator module monolithic-integrated on a semiconductor substrate, which includes a distributed feedback laser having a grating for oscillating light and to output the oscillated light through a first end and a second end of the module. An electro-absorptive modulator modulates a first light output through the first end of the distributed feedback laser, and an optical detector provides detection of a second light output through the second end of the module. The optical detector is formed opposite to the second end of the distributed feedback laser on the semiconductor substrate. A first inner window permits attenuation of the intensity of the second light and electrically insulates the distributed feedback laser and the optical detector from each other, with the first inner window being arranged between the distributed feedback laser and the optical detector.

19 Claims, 7 Drawing Sheets

ELECTRO-ABSORPTIVE OPTICAL MODULATOR MODULE HAVING MONOLITHIC INTEGRATED PHOTO DETECTOR

CLAIM OF PRIORITY

This application claims priority from an application entitled "Electro-absorptive optical modulator module having monolithic integrated photo detector," filed in the Korean Intellectual Property Office on Dec. 16, 2003 and assigned Serial No. 2003-91891, the contents of which are hereby incorporated by reference.

BACKGROUND OF THE INVENTION

1. Field of the Invention

The present invention relates to a light source for optical communication. More particularly, the present invention relates to an optical modulator module including a distributed feedback laser.

2. Description of the Related Art

Optical communication has several advantages over standard electrical communication in that optical communication can simultaneously transmit more signals to a long-distance destination, as compared with normal transmission of electric signals. As a light source of the above-mentioned optical communication, a laser capable of outputting coherent light is widely used. In particular, a semiconductor laser is widely used as well, wherein the laser is fabricated by a semiconductor fabricating process and is thus miniaturized.

With regard to recent developments in optical communications, a wavelength division multiplexing (hereinafter, referred to as "WDM") system has been used. According to this system, WDM simultaneously transmits/receives a plurality of optical signals having different wavelengths from each other and provides improved optical communication capacity and speed. The WDM optical communication uses a distributed feed laser as its light source. The laser is capable of generating an optical signal having a narrow oscillation linewidth or can be used with active optical devices capable of selectively outputting optical signals of a specific wavelength.

Wavelength filtering by using a diffraction grating is a popular filtering method, and both the distributed feedback laser and functional optical devices select a specific wavelength in a WDM optical communication network to provide filtering. In particular, the type of distributed feedback laser having a narrow oscillation spectrum required for increasing transmission distance in optical communication is well-suited for wavelength filtering by diffraction grating. There are also various types of diffraction grating structures that have been developed and disclosed in various technical publications.

With regard to semiconductor optical devices, it is noted that these devices sense the periodic change of a refractive index of an optical wave advancing toward the semiconductor optical device by wavelength filtering, and such devices reflect only a specific wavelength corresponding to a Bragg wavelength that is fed back to a gain region, thereby oscillating an optical signal having the specific wavelength.

However, one of the problems with a conventional light source is that there must be a separate modulation means for converting an electrical signal into a modulated optical signal. In addition, there are problems associated with using the conventional light source, such as an increase in the number of manufacturing processes required, a larger percentage of defects, both of which increase the unit costs of production.

In order to solve at least some of the above-mentioned problems, there have been attempts in the art to provide a monolithic integrated semiconductor photo device that comprises a distributed feedback laser and an electro-absorptive modulator that are integrated on a single substrate.

FIG. 1 is a illustrates a typical construction of the conventional electro-absorptive optical modulator module. Referring to FIG. 1, the conventional electro-absorptive optical modulator module includes an optical modulator and an optical detector 150. The optical modulator includes a distributed feedback laser 110 and an electro-absorptive modulator 120 which are integrated in the module. The optical detector 150 is arranged opposite to one end of the optical modulator.

Also, as shown in FIG. 1, the optical modulator includes a substrate 101, a lower clad 104 formed on the substrate 101, a first and a second active layer 105a and 105b formed on the lower clad 104 by a selective region growing method or a butt joint method, so that the active layers 105a and 105b may have different bandgaps from each other, and an upper clad 106 formed on the first and second active layers 105a and 105b.

The lower clad 104 includes a buffer layer (not shown) formed on the substrate 101, and an n-InP layer (not shown) formed on the buffer layer.

The first active layer 105a comprises a gain medium of the distributed feedback laser 110 and generates light having a predetermined wavelength. The distributed feedback laser 110 forms gratings having a predetermined period on the lower clad 104. Consequently, the light generated from the first active layer 105a is oscillated to be output to the electro-absorptive modulator 120.

The second active layer 105b is a gain medium of the electro-absorptive modulator 120 and progresses the light output from the first active layer 105a inside the second active layer 105b while the absorbance of the light is changed according to an applied voltage, thereby modulating the intensity of the light.

The upper clad 106 may include a p-InP layer (not shown) formed on the first and second active layers 105a and 105b, a contact layer (not shown) formed on the p-InP layer, etc.

The distributed feedback laser 110 and the electro-absorptive modulator 120 include the first and the second active layer 105a and 105b, respectively, which are continuously grown on the substrate 101. The electro-absorptive modulator 120 outputs light received from the distributed feedback laser 110.

The optical modulator shown in FIG. 1 also has a high-reflection layer 130 that is coated on one end close to the distributed feedback laser 110, and an anti-reflection layer 140 that is coated on the other end close to the electro-absorptive modulator 120. These coatings permit the high-reflection layer 130 to reflect light oscillated from the distributed feedback laser 110 to the electro-absorptive modulator 120.

The optical detector 150 can be constructed by providing a waveguide-type photodiode and arranging the waveguide-type photodiode opposite one end of the optical modulator on which the high-refection layer 130 is coated. With such a configuration it is the intensity of light output from the anti-reflection layer 140 of the optical modulator can be monitored according to an analysis of the intensity of partial light transmitted through the high-refection layer 130.

However, according to the conventional electro-absorptive optical modulator module such as the type shown in FIG. 1, the optical modulator and the optical detector are formed on separate substrates respectively, in which the optical modulator includes the distributed feedback laser and the electro-absorptive modulator and the optical detector function to monitor intensity of light oscillated from the distributed feedback laser. Accordingly, the optical axes must be necessarily aligned after the respective devices have been fabricated.

Therefore, as it is necessary to perform an optical-axis aligning process with the conventional electro-absorptive optical modulator module, there is a significant loss of process time and productivity. Furthermore, after the electro-absorptive optical modulator module has been fabricated, the optical axes may be out of alignment with each other (owing to various reasons), so that it is at times not possible to monitor the exact intensity of an optical signal.

SUMMARY OF THE INVENTION

The present invention has been made to solve at least some of the above-mentioned problems. It is an aspect of the present invention to provide an electro-absorptive optical modulator module that is easily fabricated and prevents intensity distribution of light to be detected by an optical detector from changing by the influence of a surrounding environment.

To accomplish the above-mentioned aspect, according to the present invention, there is provided an electro-absorptive optical modulator module monolithic-integrated on a semiconductor substrate. The electro-absorptive optical modulator module includes a distributed feedback laser having a grating for oscillating light and outputting the oscillated light through a first end and a second end; an electro-absorptive modulator for modulating a first light output through the first end of the distributed feedback laser; an optical detector for detecting a second light output through the second end, with the optical detector being formed opposite to the second end of the distributed feedback laser on the semiconductor substrate. A first inner window permits attenuating an intensity of the second light and electrically insulating the distributed feedback laser and the optical detector from each other, wherein the first inner window is arranged between the distributed feedback laser and the optical detector.

BRIEF DESCRIPTION OF THE DRAWINGS

The above and other objects, features and advantages of the present invention will be more apparent from the following detailed description taken in conjunction with the accompanying drawings, in which.

DETAILED DESCRIPTION

Hereinafter, preferred aspects of an electro-absorptive optical modulator module having a monolithic integrated photo detector according to the present invention will be described with reference to the accompanying drawings. For the purposes of clarity and simplicity, a detailed description of known functions and configurations incorporated herein will be omitted as it may obscure the subject matter of the present invention.

Figure 1:
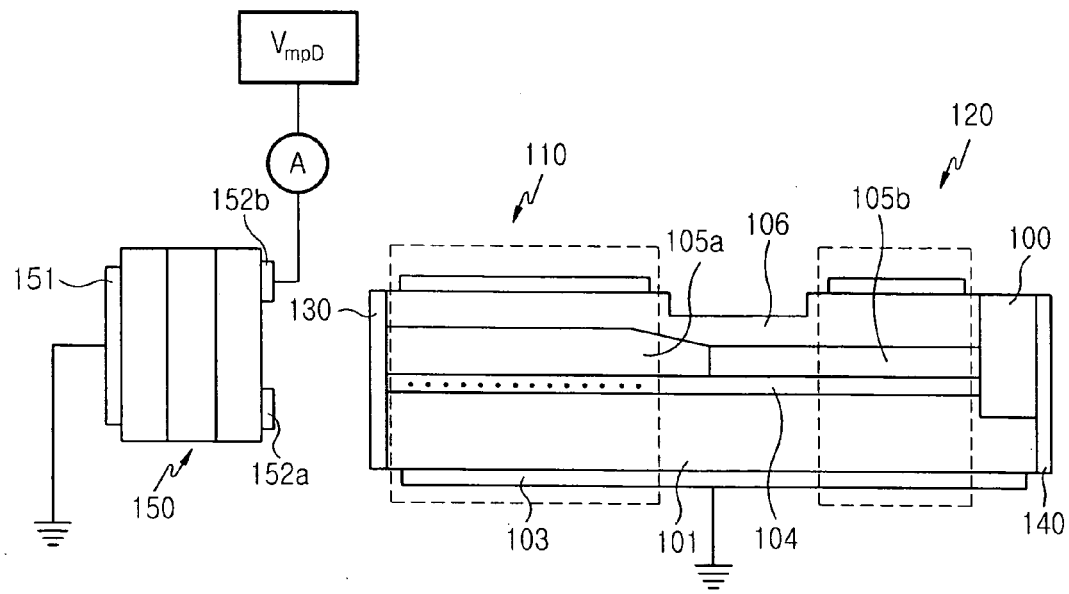
FIG. 1 is a view illustrating the construction of the conventional electro-absorptive optical modulator module.
Figure 2:
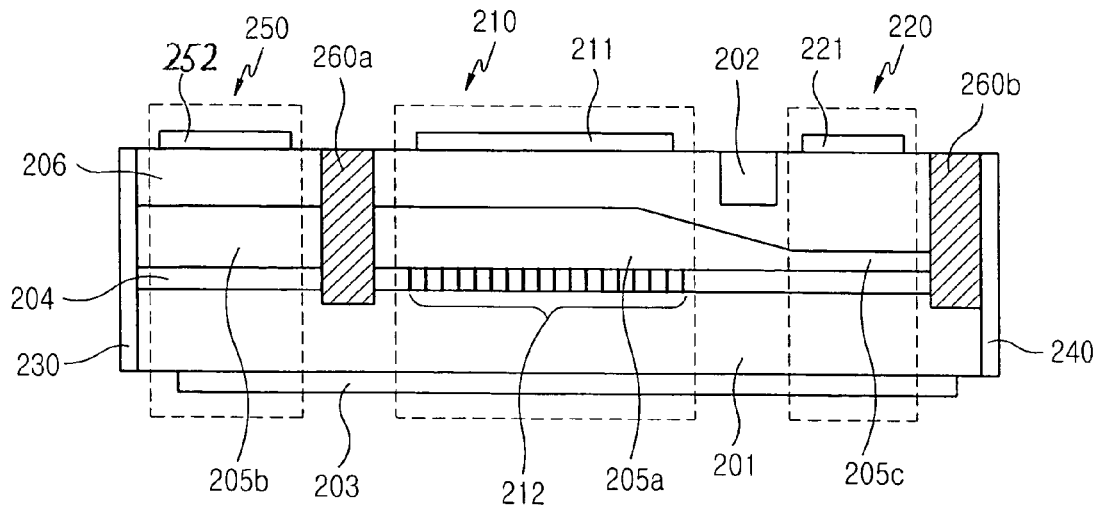
FIG. 2 is a view illustrating a construction of a monolithic integrated electro-absorptive optical modulator module according to a first aspect of the present invention.

FIG. 2 illustrates a construction of a monolithic integrated electro-absorptive optical modulator module according to a first aspect of the present invention. Referring to FIG. 2, the monolithic integrated electro-absorptive optical modulator module includes a distributed feedback laser 210 having a grating for oscillating light, an electro-absorptive modulator 220, an optical detector 250 for detecting a second light, a first inner window 260a formed between the distributed feedback laser 210 and the optical detector 250, a second inner window 260b, and a trench 202 formed for electrically insulating the distributed feedback laser 210 and the electro-absorptive modulator 220 from each other. Also, in the electro-absorptive optical modulator module, there are anti-reflection layers 230 and 240, which are coated on both ends, respectively.

The distributed feedback laser 210 includes a grating 212 for oscillating input light and a first upper electrode 211, thereby to cause oscillation of the first and second light, and output the oscillated first and second light through a first and a second end thereof, respectively. The distributed feedback laser 210 includes a lower clad 204 formed on a semiconductor substrate, a first active layer 205a formed on the lower clad 204, and an upper clad 206 formed on the first active layer 205a, thereby functioning as a waveguide for guiding the first and the second light.

Figure 3:
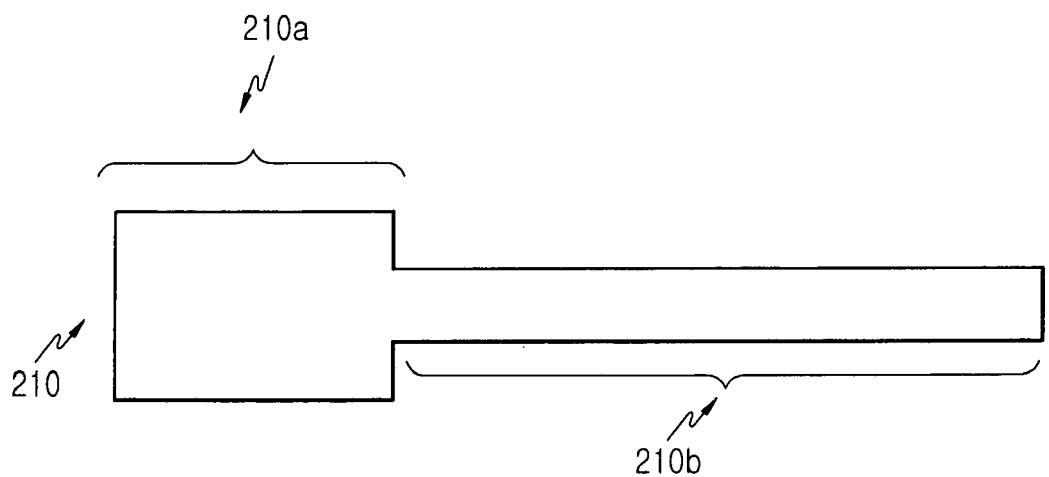
FIG. 3 is a plane view illustrating a distributed feedback laser shown in FIG. 2, which has a stepped mesa structure.
Figure 4:
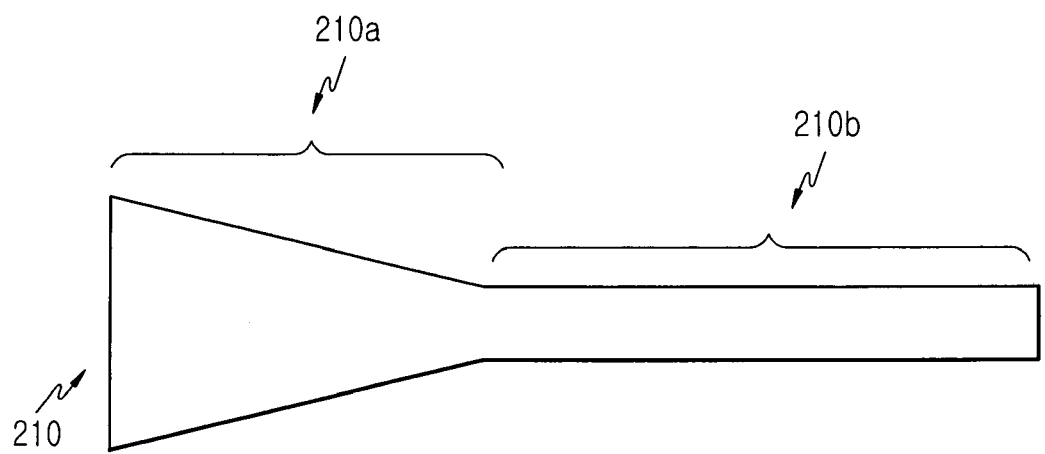
FIG. 4 is a plane view illustrating a distributed feedback laser shown in FIG. 2, which has a tapered structure.
Figure 5:
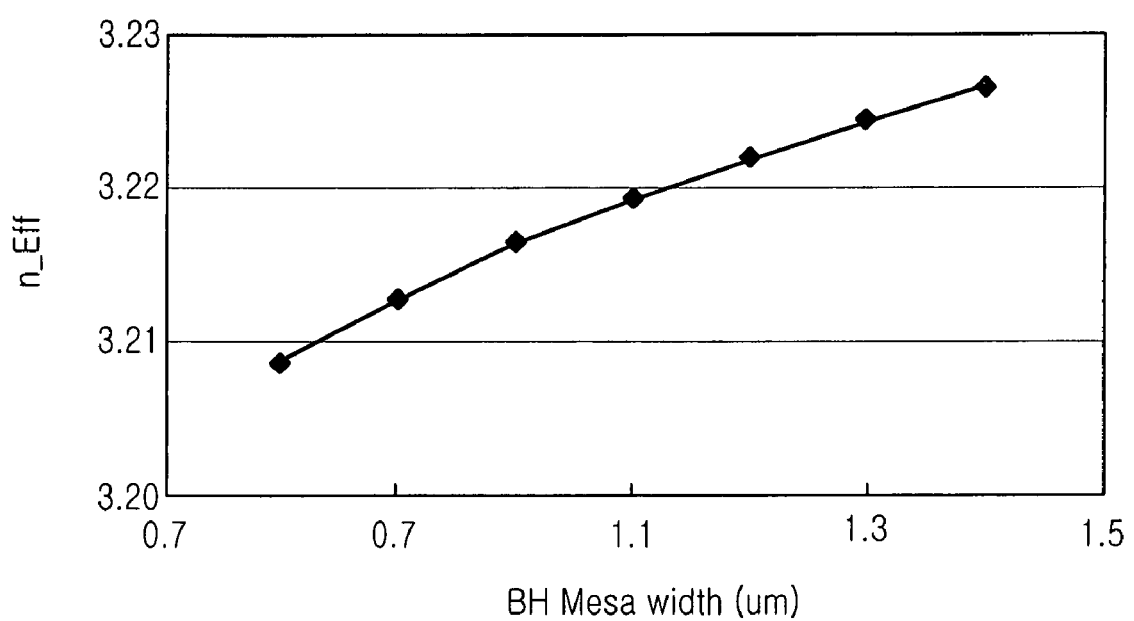
FIG. 5 is a graph showing refractive index change according to width change of the distributed feedback laser shown in FIGS. 3 and 4.

FIGS. 3 and 4 are plane views illustrating a distributed feedback laser shown in FIG. 2, and FIG. 5 is a graph showing refractive index change of the first active layer according to the change in width of the distributed feedback laser shown by the respective different widths shown in FIGS. 3 and 4. With reference to FIGS. 3 and 4, the distributed feedback laser 210 may be etched so as to have a stepped structure in which a second region 210a including the second end is wider than a first region 210b including the first end, or a tapered structure in which its width becomes increasingly wider from the first region 210b including the first end to the second region 210a including the second end.

As the distributed feedback laser 210 includes a plurality of gratings having different periods from each other, and not a single period throughout, the distributed feedback laser 210 has a higher light yield. In order to constitute the gratings having respective different periods from each other as described above, it is possible to use a method of forming a plurality of gratings having different periods from each other as expressed in equation 1, a method of changing an effective refractive index of a medium in which a grating is formed.

The method of directly forming the gratings having different periods from each other can include both a photolithography process and a holographic photolithography process, but their manufacturing processes are complicated and there is great difficulty in manufacturing gratings having fine periods in the range of 100 to 250 nm.

On the other hand, in the grating 212 of the distributed feedback laser 210 formed on the semiconductor substrate 201, a change the effective refractive index of the first active layer 205a enables the grating 212 to have the same property as a plurality of gratings having different periods from each other have, without having to change a period of the grating 212.

$$\lambda_B = n_{eff} \Lambda, \qquad \text{Equation 1}$$

where $\lambda_B$ is a central wavelength of the grating, $n_{eff}$ is a refractive index of a medium in which the grating is formed, and $\Lambda$ is a period of the grating.

The central wavelength of light oscillated from the grating 212 can be changed according to a period of the granting and according to a refractive index of a medium through which the light oscillated from the grating 212 progresses.

Referring to the graph in FIG. 5, it can be known that the wider the width of the distributed feedback laser 210, then the greater the refractive index of the first active layer 205a. In other words, it is possible to change the refractive index of the first active layer 205a by forming the first region 210b and the second region 210a having different widths from each other.

Also, by forming the second region 210a having a wider width than that of the first region 210b, it is possible to reflect the light oscillated by the grating 212 to the first end, without coating a high-reflection layer on the second end of the distributed feedback laser 210.

$$R = \left(\frac{n_2 - n_{InP}}{n_2 + n_{InP}}\right)^2 \qquad \text{Equation 2}$$

Equation 2 is a mathematical equation representing a reflection factor generated on a boundary between the first inner window 260a and the second end of the distributed feedback laser 210. Referring to equation 2, $n_2$ is a refractive index of the first active layer and the second region 210a, and $n_{InP}$ is a refractive index of the first inner window 260a.

In the case that the refractive index of the first inner window 260a is 3.17, when refractive indexes that are changed according to a width change of a first waveguide shown in FIG. 5 are substituted into equation 2, it can be shown that a reflection factor generated on a boundary between the first inner window 260a and the second end of the distributed feedback laser 210 is less than 0.001%.

In other words, by forming the first region 210b and the second region 210a having different widths from each other, the distributed feedback laser 210 can still exhibit the same properties without the need to form a high-reflection layer, as when compared with the above-mentioned formed high-reflection layer. Also, from among the light generated from the distributed feedback laser 210, a second light that passes through the second end is detected by the optical detector 250.

The electro-absorptive modulator 220 is grown on the semiconductor substrate 201 while being arranged opposite to the first end of the distributed feedback laser 210. The modulator 220 has a second upper electrode 221 for driving the electro-absorptive modulator. The electro-absorptive modulator 220 also includes a lower clad 204 formed on the semiconductor substrate 201, a second active layer 205c formed on the lower clad 204, and an upper clad 206 formed on the second active layer 205c.

The second active layer 205c has a property that its absorption rate changes according to voltages applied to the second upper electrode 221. The electro-absorptive modulator 220 must exhibit the property that its absorption rate is relatively small at a low voltage and its absorption rate is relatively large at a high voltage, so as to modulate the intensity of light oscillating from the distributed feedback laser 210. To this end, it is necessary that the electro-absorptive modulator 220 has an absorption edge wavelength that is smaller than a wavelength of the first light at a low voltage.

The optical detector 250 is grown on the semiconductor substrate 201 while being arranged opposite to the second end of the distributed feedback laser 210, and includes a third upper electrode 252 for applying a driving voltage to the optical detector 250.

The optical detector 250 includes a lower clad 204 formed on the semiconductor substrate 201, a third active layer 205b formed on the lower clad 204, and an upper clad 206 formed on the third active layer 205b. The optical detector detects an output power of the second light output from the second end of the distributed feedback laser 210, so that it is possible to monitor the output power of the first light.

In other words, the optical detector is integrated on the semiconductor substrate 201 with the distributed feedback laser 210, there is no worry that the optical axes that have drifted out of alignment, providing an advantage in that there is a minimal drift distribution of goods.

The first inner window 260a is located between the distributed feedback laser 210 and the optical detector 250, and provides an attenuation of the intensity of the second light and electrically insulates the optical detector 250 from the distributed feedback laser 210. The first inner window may be formed by doping Fe or a similar metal into an insulating layer that is grown in a cleavage etched up to the surface of the semiconductor substrate 201 between the distributed feedback laser 210 and the optical detector 250.

Figure 6:
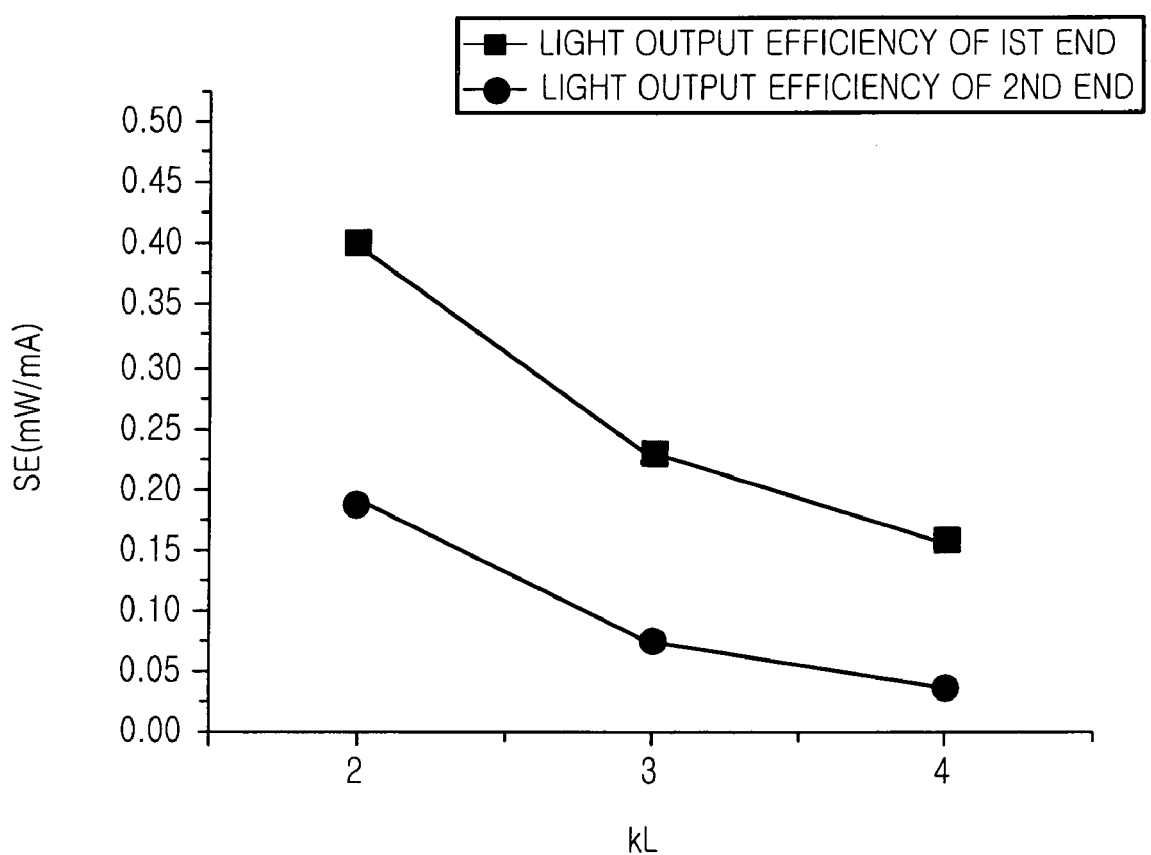
FIG. 6 is a graph comparatively showing powers of a first and a second light output from the distributed feedback laser shown in FIG. 2.

FIG. 6 comprises a graph that comparatively shows output efficiencies of a first and a second light output from the distributed feedback laser shown in FIG. 2. In addition, FIG. 7 comprises a graph showing optical coupling efficiencies of the second light into the optical detector 250 according to length of the first inner window shown in FIG. 2. Referring to FIG. 6, 'kL' is expressed on the x-axis as values that are calculated by multiplying a coupling coefficient 'k' for a grating structure of the distributed feedback laser 210 by laser lengths 'L', and can be defined as a feedback degree of light generated by a grating. Also, the respective rates of increase in power output from the first and the second light with respect to incremental driving of a current through the first upper electrode 211 are referred to as the respective output efficiencies of the first and the second light. In this drawing, a black circle '-●-' represents an output power of the second light and a black square '-■-' represents an output power of the first light, respectively.

In the distributed feedback laser 210, when 'kL' is within a range between 3 and 4, the operational properties of the laser, such as an oscillation threshold current, dependency of external reflection, etc., can all be optimized. In this case, with regard to the graph shown in FIG. 6, it can be seen that output power of the second light output through the second end has a rate between 20% to 30% with respect to that of the first light through the first end in the distributed feedback laser 210.

For example, when a distributed feedback laser requires a first light having an output power that is equal to or more than 10 mW, in this case, a current equal to or less than 2 mA must be maintained in a second light detected by the optical detector. Therefore, it is necessary for the first inner window 260*a* to attenuate the output power of the second light by 5 dB or more.

Figure 7:
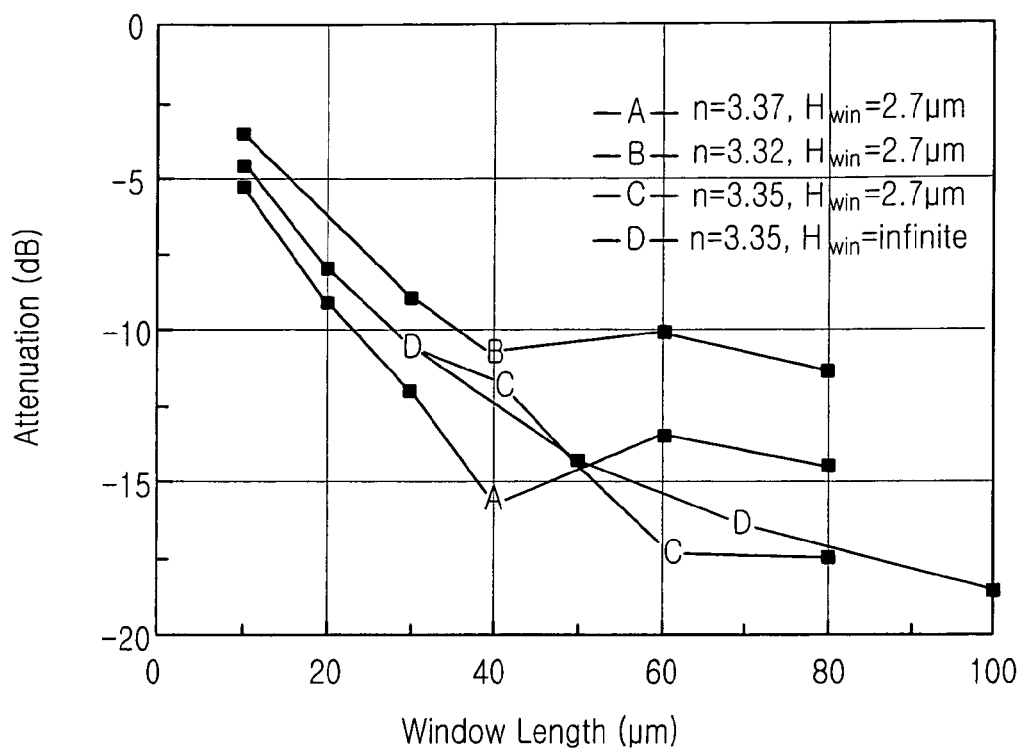
FIG. 7 is a graph showing optical coupling efficiencies according to length of a first inner window shown in FIG. 2.

Thus, by adjusting spacing between the optical detector 250 and the distributed feedback laser 210 when the 'kL' is between 3 and 4, the first inner window 260*a* can attenuate the amount of the output power of the second light that is output through the second end and is applied to the optical detector 250. The result is that a current of 2 mA or less may be generated in the optical detector 250 when the output power of the first light output through the first end is more than 10 mW. Referring to FIG. 7, it is shown that a length of the first inner window 260*a* is 30 μm, an optical attenuation effect of about 10 dB is shown. In this case, a current of the second light detected by the optical detector 250 has a value between 200 μm and 1 mA, which satisfies the above-mentioned condition of a current of 2 mA or less.

The second inner window 260*b* is arranged at another end of the optical modulator and permits light input from the second active layer 205*c* to diverge, thereby preventing the first light from passing the electro-absorptive modulator 220 and from oppositely progressing to the distributed feedback laser 210.

The anti-reflection layers 230 and 240 are thus preferably coated on both ends of the electro-absorptive optical modulator module, so as to thereby minimize an amount of light reflected on both ends of the electro-absorptive optical modulator module together with the second inner window 260*b*.

The trench 202 is formed in the upper clad between the first and second upper electrodes 211 and 221 so as to insulate the first and second upper electrodes 211 and 221 from each other.

Moreover, according to the electro-absorptive optical modulator module, the upper and lower clads 206 and 204 are respectively formed on the semiconductor substrate 201, and the active layers 205*a* to 205*c* that have different bandgaps from each other are grown on the lower clad 204 by a selective region growing method, a butt joint method, etc., so that the distributed feedback laser 210, the optical detector 250, and the electro-absorptive modulator 220 The distributed feedback laser 210 is etched in such a manner that it has different widths along the length of the semiconductor substrate 201, so that it can obtain the same operational properties as that obtained when a period of the grating 212 is changed, without actually having to changing a period of the grating 212. Moreover, the change of the width causes a change in the refractive index, which provides an operation property similar to having a high-reflection layer, without actually forming a high-reflection layer on the second end.

The bandgaps of the active layers 205*a* to 205*c* may be formed in various sizes as needed. The active layers 205*a* to 205*c* may be formed in such a manner that an energy bandgap of the electro-absorptive modulator 220 is the largest and an energy bandgap of the distributed feedback laser 210 is the smallest.

FIGS. 8 to 12 are views for explaining a method of fabricating a single-integrated electro-absorptive optical modulator module according to a second aspect of the present invention. Hereinafter, a method of fabricating the electro-absorptive optical modulator module will be described with reference to FIGS. 8 to 12, and the fabricating method includes the following processes.

A common electrode 203 is formed on the upper surface of the semiconductor substrate 201, and the semiconductor substrate 201 may be made from materials such as n-InP, etc. The lower clad 204 is formed on the semiconductor substrate 201, and the lower clad 204 includes a buffer layer 204*a* grown on the semiconductor substrate 201 and an n-InP layer 204*b* formed on the buffer layer 204*a*.

Figure 8:
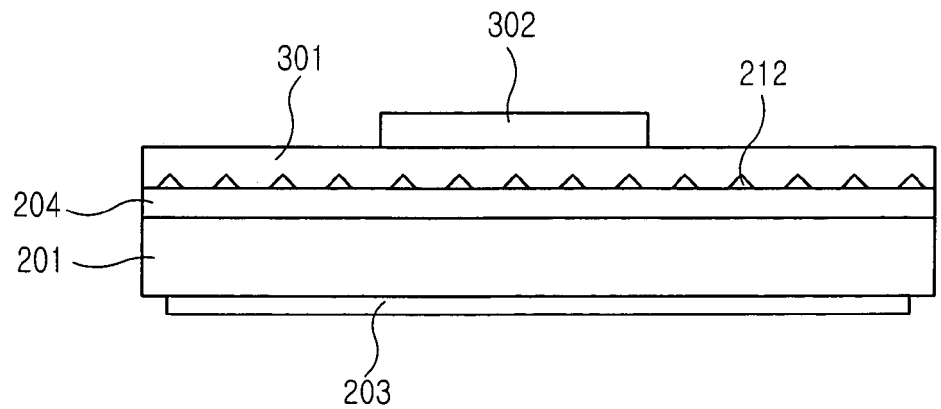
FIGS. 8 to 12 are views for explaining a method of fabricating an electro-absorptive optical modulator module according to a second aspect of the present invention.
Figure 9:
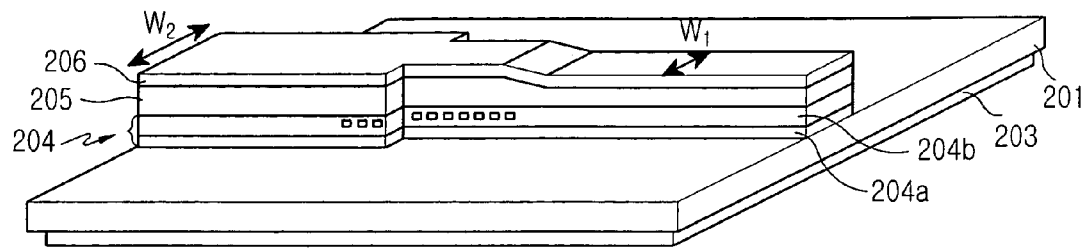
Figure 10:
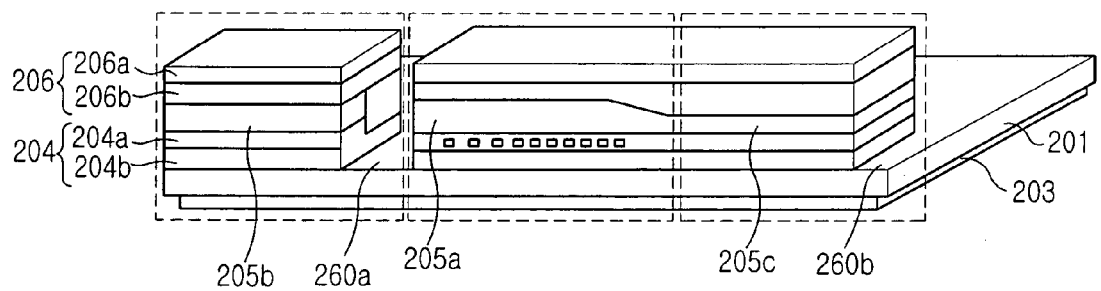
Figure 11:
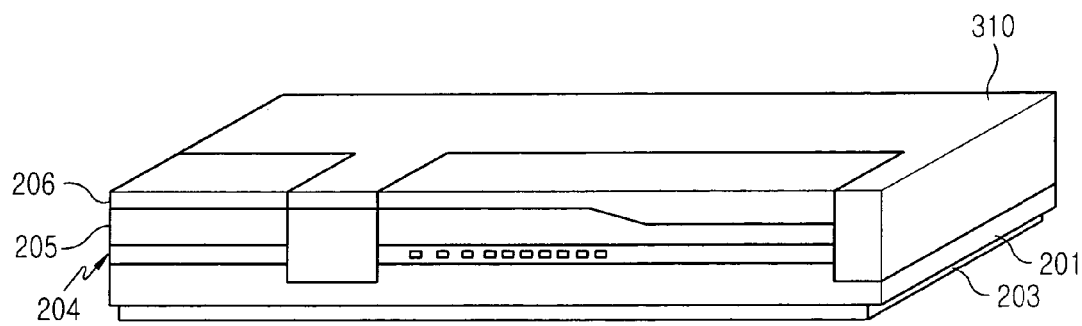
Figure 12:
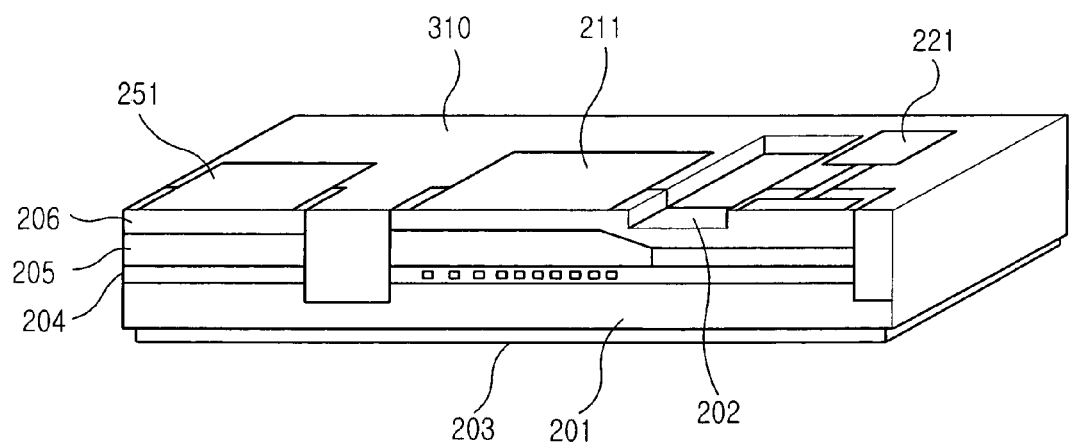

After forming a photoresist layer having a grating pattern on the lower clad 204 by using a photolithography process, the lower clad 204 is then etched to form a diffraction grating 212. As shown in FIG. 8, after a material 301 having a different refractive index from that of the grating is grown, and a photoresist layer 302 is formed only on one region (a region to form the distributed feedback laser) of the above-mentioned structure, and then a portion of the grating corresponding to the other region is etched to be removed, so that the grating is formed only on a portion of the lower clad 204.

The first, second, and third active layers 205*a*, 205*c*, and 205*b* for the distributed feedback laser, the electro-absorptive modulator, and the optical detector are all formed simultaneously by methods such as a selective region growing method, a butt joint method, etc. The respective active layers 205*a*, 205*c*, and 205*b* may be constructed from InGaAsP, and have a multi-quantum well structure. Also, the active layers 205*a*, 205*c*, and 205*b* are grown to have predetermined energy bandgaps according to need.

The upper clad 206 is formed on the active layers 205*a*, 205*c*, and 205*b*, and the upper clad 206 includes a p-InP layer 206*b* grown on the active layers 205*a*, 205*c*, and 205*b* and a contact layer 206*a* grown on the p-InP layer 206*b*.

Layers ranging from the lower clad 204 to the upper clad 206, along with the active layers 205*a*, 205*c*, and 205*b* grown on the semiconductor substrate 201, are etched as waveguides in mesa structures by using a method such as a photolithography process or the like.

Therefore, in the process of etching the above-mentioned respective waveguides, not only are boundary regions arranged between the respective waveguides but also one end region of a waveguide is located on one end of the electro-absorptive optical modulator module spaced from the boundary regions are simultaneously etched, and an insulating layer 310 made of InP material is grown in the etched regions. Fe or an element/compound with similar characteristics is doped into the insulating layer 310 grown in the boundary regions between the respective waveguides and the insulating layer 310 grown in the one end of the electro-absorptive optical modulator module. By providing the aforementioned structure, the first inner window 260*a* and the second inner window 260*b* are formed, respectively.

Each of the first to third upper electrodes 211, 221, and 252 is independently formed on the upper surface of the contact layer 206*a*.

A portion of the contact layer 206*a* and the p-InP layer 206*b* that are exposed between the first upper electrode 211 and the second upper electrode 221 are etched to form a trench, so that insulation resistance of 10 kΩ or more is realized between the first upper electrode 211 and the second upper electrode 221. Through such processes, the distributed feedback laser, the electro-absorptive modulator, and the optical detector are integrated on the semiconductor substrate 201. Also, anti-reflection layers (not shown) of dielectric materials may be coated on both ends of the electro-absorptive optical modulator module.

According to the electro-absorptive optical modulator module of the present invention, the optical detector for monitoring the intensity of light output from the distributed feedback laser is a monolithic-integrated on the semiconductor substrate on which the distributed feedback laser is formed, so that it is easy to align optical axes of the optical detector and the distributed feedback laser, and there is an advantage in that malfunction of the optical detector due to environmental influence can be prevented. Also, according to the electro-absorptive optical modulator module of the present invention, an inner window is formed between the optical detector and the distributed feedback laser, so that it is easy to ensure electrical insulation characteristics between the optical detector and the distributed feedback laser.

While the invention has been shown and described with reference to certain preferred aspects thereof, it will be understood by those skilled in the art that various changes in form and details may be made therein without departing from the spirit and scope of the invention as defined by the appended claims.

What is claimed is:

1. An electro-absorptive optical modulator module that is monolithically-integrated on a semiconductor substrate, the electro-absorptive optical modulator module comprising:
   a distributed feedback laser having a grating so as to oscillate light output by the laser and outputting the oscillated light through a first end and a second end of the distributed feedback laser, the first and second ends having different widths;
   an electro-absorptive modulator for modulating a first light output through the first end of the distributed feedback laser;
   an optical detector for detecting a second light output through the second end, the optical detector being formed opposite to the second end of the distributed feedback laser on the semiconductor substrate; and
   a first inner window for attenuating intensity of the second light and electrically insulating the distributed feedback laser and the optical detector from each other, wherein the first inner window is arranged between the distributed feedback laser and the optical detector.

2. The module as recited in claim 1, further comprising an insulating layer grown on the semiconductor substrate so that it surrounds the distributed feedback laser, the optical detector, and the electro-absorptive modulator; and
   wherein the first inner window is formed by adding Fe to the insulating layer consisting of InP.

3. The module as claimed in claim 1, further comprising:
   a second inner window for preventing the modulated light from reflecting to the distributed feedback laser by being formed substantially near one end of the electro-absorptive modulator on one side of the semiconductor substrate and permitting the light, which is modulated in the electro-absorptive modulator, to diverge; and
   a first and a second waveguide having a trench formed there between.

4. The module as recited in claim 1, further comprising:
   a lower clad formed on the semiconductor substrate;
   a first active layer, a second active layer, and a third active layer formed successively on the lower clad, and each of the layers having separate bandgaps with a one-to-one correspondence to the distributed feedback laser, the optical detector, and the electro-absorptive modulator, respectively; and
   an upper clad formed on the respective first active layer, second active layer and third active layer.

5. The module as recited in claim 1, wherein the distributed feedback laser comprises a tapered structure in which its width gradually increases from a first region including the first end to a second region including the second end.

6. The module as recited in claim 1, wherein the distributed feedback laser comprises a stepped structure in which a second region including the second end is wider than a width of a first region including the first end.

7. The module as recited in claim 1, wherein the distributed feedback laser comprises a tapered structure in which a width of a first region including the first end is constant and a width of a second region extending from the first region increases toward the second end.

8. The module as recited in claim 4, further comprising:
   a common electrode formed on the lower surface of the semiconductor substrate; and
   a plurality of electrode means for driving the distributed feedback laser, the electro-absorptive modulator, and the optical detector, respectively.

9. The module as recited in claim 8, wherein the electrode means comprises:
   a first upper electrode for applying a driving current to drive the distributed feedback laser;
   a second upper electrode for applying a driving current to drive the electro-absorptive modulator; and
   a third upper electrode for applying a driving current to drive the optical detector.

10. A method of providing an electro-absorptive optical modulator module that is monolithically-integrated on a semiconductor substrate, comprising the steps of:
    (a) providing a distributed feedback laser having a grating formed to oscillate light output by the laser through a first end and a second end of the distributed feedback laser, the first and second ends having different widths;
    (b) arranging an electro-absorptive modulator for modulating a first light output through the first end of the distributed feedback laser;
    (c) forming an optical detector for detecting a second light output through the second end, the optical detector being formed opposite to the second end of the distributed feedback laser on the semiconductor substrate; and
    (d) arranging a first inner window between the distributed feedback laser and the optical detector for attenuating intensity of the second light and electrically insulating the distributed feedback laser and the optical detector from each other.

11. The method as recited in claim 10, further comprising providing an insulating layer grown on the semiconductor substrate so that it surrounds the distributed feedback laser, the optical detector, and the electro-absorptive modulator; and
    wherein the first inner window is formed by adding a metal to the insulating layer consisting of InP.

12. The method as recited in claim 11, wherein the metal comprises Fe.

13. The method as recited in claim 10, further comprising the steps of:
    arranging a second inner window for preventing the modulated light from reflecting to the distributed feedback laser by being formed substantially near one end of the electro-absorptive modulator on one side of the semiconductor substrate and permitting the light, which is modulated in the electro-absorptive modulator, to diverge; and arranging a first and a second waveguide having a trench formed there between.

14. The method as recited in claim 10, further comprising the steps of:
forming a lower clad formed on the semiconductor substrate;
forming a first active layer, a second active layer, and a third active layer successively on the lower clad, wherein each of the layers having separate bandgaps with a one-to-one correspondence to the distributed feedback laser, the optical detector, and the electro-absorptive modulator, respectively; and
forming an upper clad on the respective first active layer, second active layer and third active layer.

15. The method as recited in claim 10, wherein the distributed feedback laser provided in step (a) comprises a tapered structure in which its width gradually increases from a first region including the first end to a second region including the second end.

16. The method as recited in claim 10, wherein the distributed feedback laser provided in step (a) comprises a stepped structure in which a second region including the second end is wider than a width of a first region including the first end.

17. The module as recited in claim 10, wherein the distributed feedback laser provided in step (a) comprises a tapered structure in which a width of a first region including the first end is constant and a width of a second region extending from the first region increases toward the second end.

18. The method as recited in claim 14, further comprising:
forming a common electrode on the lower surface of the semiconductor substrate; and
arranging a plurality of electrode means for driving the distributed feedback laser, the electro-absorptive modulator, and the optical detector, respectively.

19. The module as recited in claim 18, wherein the electrode means comprises:
a first upper electrode for applying a driving current to drive the distributed feedback laser;
a second upper electrode for applying a driving current to drive the electro-absorptive modulator; and
a third upper electrode for applying a driving current to drive the optical detector.

* * * * *